United States Patent
Jayasena et al.

(10) Patent No.: US 9,535,831 B2
(45) Date of Patent: Jan. 3, 2017

(54) PAGE MIGRATION IN A 3D STACKED HYBRID MEMORY

(71) Applicant: Advanced Micro Devices, Inc., Sunnyvale, CA (US)

(72) Inventors: Nuwan S. Jayasena, Sunnyvale, CA (US); Gabriel H. Loh, Bellevue, WA (US); James M. O'Connor, Austin, TX (US); Niladrish Chatterjee, Salt Lake City, UT (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 260 days.

(21) Appl. No.: 14/152,003

(22) Filed: Jan. 10, 2014

(65) Prior Publication Data

US 2015/0199126 A1 Jul. 16, 2015

(51) Int. Cl.
*G06F 12/00* (2006.01)
*G06F 12/02* (2006.01)
*G06F 3/06* (2006.01)
*G06F 12/08* (2016.01)
*G11C 11/00* (2006.01)
*G06F 12/06* (2006.01)

(52) U.S. Cl.
CPC .......... *G06F 12/0292* (2013.01); *G06F 3/061* (2013.01); *G06F 3/0685* (2013.01); *G06F 12/0638* (2013.01); *G06F 12/0897* (2013.01); *G11C 11/005* (2013.01)

(58) Field of Classification Search
None
See application file for complete search history.

(56) References Cited

U.S. PATENT DOCUMENTS

| | | |
|---|---|---|
| 5,857,210 A | 1/1999 | Tremblay et al. |
| 5,873,105 A | 2/1999 | Tremblay et al. |
| 2007/0220207 A1* | 9/2007 | Black ............... G06F 12/084 711/118 |
| 2009/0070721 A1* | 3/2009 | Solomon ............ G06F 17/5045 716/118 |

(Continued)

OTHER PUBLICATIONS

Zhang et al. (Exploring Phase Change Memory and 3D Die-Stacking for Power/Thermal Friendly, Fast and Durable Memory Architectures: 2009 IEEE, pp. 101-112).*

(Continued)

*Primary Examiner* — Kaushikkumar Patel

(57) ABSTRACT

A die-stacked hybrid memory device implements a first set of one or more memory dies implementing first memory cell circuitry of a first memory architecture type and a second set of one or more memory dies implementing second memory cell circuitry of a second memory architecture type different than the first memory architecture type. The die-stacked hybrid memory device further includes a set of one or more logic dies electrically coupled to the first and second sets of one or more memory dies, the set of one or more logic dies comprising a memory interface and a page migration manager, the memory interface coupleable to a device external to the die-stacked hybrid memory device, and the page migration manager to transfer memory pages between the first set of one or more memory dies and the second set of one or more memory dies.

10 Claims, 7 Drawing Sheets

(56) References Cited

U.S. PATENT DOCUMENTS

| | | | | |
|---|---|---|---|---|
| 2011/0066790 A1* | 3/2011 | Mogul | ................. | G06F 12/023 |
| | | | | 711/103 |
| 2013/0290607 A1* | 10/2013 | Chang | ................. | G06F 12/0895 |
| | | | | 711/103 |
| 2014/0019677 A1* | 1/2014 | Chang | ................. | G06F 3/0619 |
| | | | | 711/105 |

OTHER PUBLICATIONS

Dong et al. (Simple but Effective Heterogeneous Main Memory with On-Chip Memory Controller Support: 2010 IEEE, pp. 11).*
Sun et al. (A Novel Architecture of the 3D stacked MRAM L2 Cache for CMPs: 2008 IEEE, pp. 239-249).*
Ramos et al. (Page Placement in Hybrid Memory Systems: 2011 ACM; May 31, 2011; pp. 11).*
Definition of "data transfer" from Dictionary.com, p. 1.*
Definition of "data transfer" from PC Magazine encyclopedia, p. 1.*
U.S. Appl. No. 13/724,338, filed Dec. 21, 2012, entitled "Compound Memory Operations in a Logic Layer of a Stacked Memory".

* cited by examiner

US 9,535,831 B2

PAGE MIGRATION IN A 3D STACKED HYBRID MEMORY

BACKGROUND

Field of the Disclosure

The present disclosure generally relates to memory systems and, more particularly, to hybrid memory systems.

Description of the Related Art

In conventional processing systems, migration of memory pages between different memories of a memory hierarchy are orchestrated by the host processor, either through the use of direct memory access (DMA) engines or the execution of load/store instructions. Such page migrations involve the reading of the contents from the source page into the host processor and then writing the contents out from the host processor to the destination page. This page migration process thus often requires significant stalling of other processes as it often consumes resources of the host processor and the bandwidth of the memory bus connecting the host processor to the source and destination memories. Moreover, conventional approaches to page migrations require that the system software (e.g., the operating system) executing on the host processor make the page migration decisions among the different levels of the memory hierarchy and maintain the address translation information necessary to account for implemented page migrations. This decision process, and the associated address translation maintenance, can tax the efficiency of the system software.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION OF PREFERRED EMBODIMENTS

Figure 1:
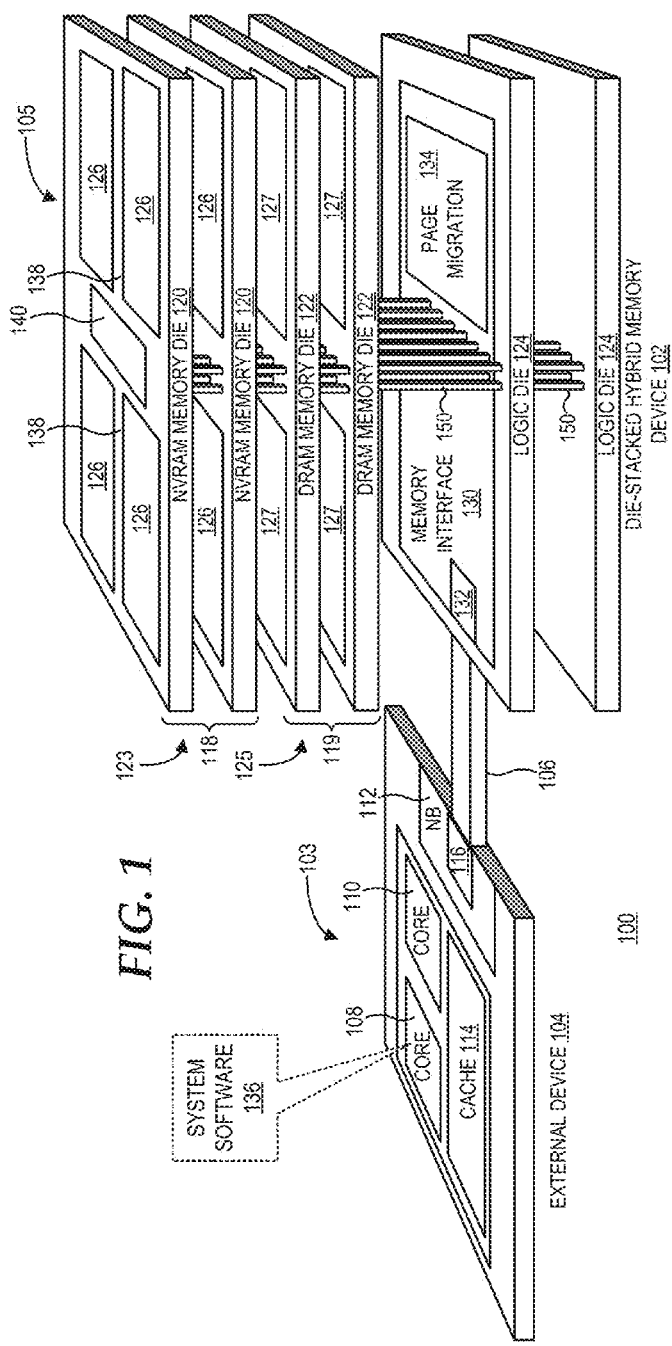
FIG. 1 is a diagram illustrating an exploded perspective view of a vertical-stack configuration of a processing system implementing a die-stacked hybrid memory device with a logic die implementing a page migration manager to facilitate intra-memory page transfers in accordance with some embodiments.

FIGS. 1-8 illustrate example techniques for improved processing efficiency and memory wear leveling in a processing system through the use of a die-stacked hybrid memory device implementing an integrated page migration manager to offload page migration management. The die-stacked hybrid memory device includes multiple memories of different memory types, with each memory implemented as a corresponding set of one or more stacked memory dies implementing memory cell circuitry of a corresponding memory architecture type. For example, one set of stacked memory dies may implement a non-volatile random access memory (NVRAM), such as phase-change memory (PCM) or Flash memory, and the other set of stacked memory dies may implement a volatile random access memory, such as dynamic random access memory (DRAM). The die-stacked hybrid memory device further includes a set of one or more logic dies, at least one of which implements hardware logic for a memory interface and the page migration manager. The memory interface is coupled to the memory cell circuitry of the sets of stacked memory dies and is coupleable to one or more devices external to the die-stacked hybrid memory device. The memory interface operates to perform memory accesses in response to memory access requests from the one or more external devices.

The page migration manager comprises logic to facilitate the migration of pages between the sets of stacked memory dies (referred to herein as an "intra-memory page migration" or "intra-memory page transfer"). Generally, the page migrations between the different types of memory within the die-stacked hybrid memory device are performed with the intent of one or more of: reducing memory access latency (e.g., moving a frequently-accessed page out of slower non-volatile memory into faster volatile memory), reducing power consumption, or improving write-endurance (e.g., moving a frequently modified page from a phase-change memory to a DRAM memory). The page migration manager may operate in a software-initiated mode whereby the page migrations are initiated in response to a migration command from system software running on an external device. Alternatively, the page migration manager may operate in an autonomous mode whereby the page migration manager initiates page migrations independent of the system software. In this mode, the page migrations may be visible to the system software or the page migrations may be invisible to the system software.

Due to the page migration manager's tight integration with the memory dies, the page migration manager can facilitate the transfer of memory pages between the sets of stacked memory dies with higher bandwidth and lower latency and power consumption compared to the conventional page migration processes as the data of the transferred page is not required to exit and reenter the die-stacked hybrid memory device. Moreover, the offloading of page migration operations to the die-stacked hybrid memory device permits the external devices to perform other tasks focusing on program execution, thereby increasing the overall processing throughput of the system.

For ease of illustration, techniques are described in the example context of a hybrid memory system implementing two different memories of different memory architectures, one memory architecture comprising a non-volatile memory architecture and the other memory architecture comprising a volatile memory architecture. However, using the guidelines provided herein, the techniques may be similarly implemented for hybrid memory systems implementing two memories having other types of memory architectures (e.g., two different types of volatile memory architecture), or in hybrid memory systems implementing three or more memories of differing memory architectures.

FIG. 1 illustrates a processing system 100 in accordance with some embodiments. The processing system 100 can comprise any of a variety of computing systems, including a notebook or tablet computer, a desktop computer, a server, a network router, switch, or hub, a computing-enabled cellular phone, a gaming console, a personal digital assistant, and the like. In the depicted example, the processing system 100 includes a die-stacked hybrid memory device 102 and at least one external device 104 coupled via an inter-device interconnect 106. While the processing system 100 typically includes multiple external devices 104 coupled to the die-stacked hybrid memory device 102 via the interconnect 106, FIG. 1 depicts a single external device for ease of illustration. The processing system 100 also can include a variety of other components not illustrated in FIG. 1, such as one or more display components, storage devices, input devices (e.g., a mouse or keyboard), and the like. In some embodiments, the one or more external devices 104 are implemented separately or in combination as one or more integrated circuit (IC) packages 103 and the die-stacked hybrid memory device 102 is implemented as an IC package 105 separate from the IC packages 103 implementing the one or more external devices 104. In some embodiments, some or all of the external devices 104 and the die-stacked hybrid memory device 102 are implemented as separate sets of dies connected via an interposer in the same IC package. In either instance, the term "external device," as used herein, refers to a device external to the die-stacked hybrid memory device 102.

In the illustrated example, the external device 104 is depicted as a processor. External devices can include other types of devices, such as input/output (I/O) controllers. In this example, the external device 104 comprises one or more processor cores 108 and 110, a northbridge 112, one or more caches 114 (e.g., a L1 cache, a L2 cache, etc.), and various peripheral components (not shown). The processor cores 108 and 110 can include any of a variety of processor cores and combinations thereof, such as a central processing unit (CPU) core a graphics processing unit (GPU), a digital signal processor (DSP), and the like. The peripheral components can include, for example, an integrated southbridge or input/output controller, and the like. The northbridge 112 includes, or is associated with, a memory controller interface 116 comprising a physical interface (PHY) connected to the conductors of the interconnect 106.

The interconnect 106 can be implemented in accordance with any of a variety of conventional interconnect or bus architectures, such as a Peripheral Component Interconnect-Express (PCI-E) architecture, a HyperTransport architecture, a QuickPath Interconnect (QPI) architecture, and the like. Alternatively, the interconnect 106 can be implemented in accordance with a proprietary bus architecture. The interconnect 106 includes a plurality of conductors coupling transmit/receive circuitry of the memory controller interface 116 of the external device 104 with the transmit/receive circuitry of the memory interface 130 of the die-stacked hybrid memory device 102. The conductors can include electrical conductors, such as printed circuit board (PCB) traces or cable wires, optical conductors, such as optical fiber, or a combination thereof.

In at least one embodiment, the die-stacked hybrid memory device 102 implements hybrid memory, that is, a combination of memories of different memory architecture types. As illustrated by the exploded perspective view of FIG. 1, the die-stacked hybrid memory device 102 comprises a set 118 of one or more stacked memory dies 120 and a set 119 of one or more stacked memory dies 122. Each memory die 120 of the set 118 comprises memory cell circuitry 126 implementing bitcells in accordance with one type of memory architecture. Each memory die 122 of the set 119 comprises memory cell circuitry 127 implementing bit cells in accordance with another type of memory architecture. For purposes of illustration, the memory cell circuitry 126 is described herein as implementing a non-volatile random access memory (NVRAM) architecture type and the memory cell circuitry 126 is described herein as implementing a dynamic random access memory (DRAM) memory architecture or other volatile memory architecture type (such as a static random access memory architecture. Example non-volatile memory architecture types include, for example, read-only memory (ROM), Flash memory, ferroelectric RAM (F-RAM), spin-transfer torque magnetoresistive RAM (STT-MRAM), phase change memory (PCM), and the like. Thus, for ease of reference, the set 118 of one or more memory dies 120 is also referred to as the "NVRAM memory 123" and the set 119 of one or more memory dies 122 is referred to as the "DRAM memory 125", and the combination of the NVRAM memory 123 and the DRAM memory 125 is referred to herein as "the stacked memory" of the die-stacked hybrid memory device 102. Thus, while identified as separate memories for convenience, in at least one embodiment the memory interface 130 presents the combination of the NVRAM memory 123 and the DRAM memory 125 as a unified, monolithic system memory to the external device 104 as described below. Moreover, although a particular implementation having two sets of memory dies is described, the present disclosure is not limited to this implementation, and instead includes other implementations having three or more sets of memory dies with different memory architecture types.

As also illustrated by the exploded perspective view of FIG. 1, the die-stacked hybrid memory device 102 further includes a set of one or more logic dies 124. The one or more logic dies 124 implement hardware logic to facilitate access to the memory of the die-stacked hybrid memory device 102. This logic includes, for example, the memory interface 130, built-in self test (BIST) logic (not shown), and the like. The memory interface 130 can include, for example, receivers and line drivers, memory request buffers, scheduling logic, row/column decode logic, refresh logic, data-in and data-out buffers, clock generators, and the like. Although the illustrated embodiment depicts a memory controller implemented at the external device 104, in some embodiments a memory controller instead may be implemented at the memory interface 130. The memory interface 130 further comprises a bus interface 132 comprising a PHY coupleable to the conductors of the interconnect 106, and thus coupleable to the external devices of the processing system 100.

In addition to implementing logic to facilitate access to the memory cell circuitry 126 and 127 implemented by the memory dies 120 and 122, respectively, one or more logic dies 124 implement a page migration manager 134 to facilitate memory page migrations between the memory cell circuitry 126 implemented by the memory dies 120 and the memory cell circuitry 127 implemented by the memory dies 122 (that is between the NVRAM memory 123 and the DRAM memory 125). The page migration manager 134 is coupled to (or implemented as part of) the memory interface 130 and comprises logic to facilitate the transfer, or "migration", of memory pages between the NVRAM memory 123 and the DRAM memory 125. In the illustrated example, the page migration manager 134 and the memory interface 130 are implemented on the same logic die 124. In some embodiments, the memory interface 130 and the page migration manager 134 may be implemented on different logic dies. For example, the memory interface 130 may be implemented at one logic die 124 and the page migration manager 134 may be implemented at another logic die 124. In some embodiments, one or both of the memory interface 130 and the page migration manager 134 may be implemented across multiple logic dies. To illustrate, the memory interface 130 and logic circuitry of the page migration manager 134 may be implemented at one logic die 124 and certain storage elements of the page migration manager 134 (e.g., a cache or content addressable memory) may be implemented at another logic die 124.

The page migration manager 134 operates to offload page migration tasks from system software 136 (e.g., an operating system, a hypervisor, or an application) running on the external device 104. In some instances, the page migration manager 134 operates in a software-initiated migration mode whereby the migration of memory pages is initiated by the system software 136. In this mode, the system software 136 initiates a page migration by sending a migration command to the die-stacked hybrid memory device 102, in response to which the page migration manager 135 performs the indicated page migration within the die-stacked hybrid memory device 102. In such instances, the system software 136 typically manages the address translation tasks resulting from this page migration for memory access requests issued by the external device 104. The software-initiated migration mode is described in greater detail below with reference to FIG. 4.

In other instances, the page migration manager 134 operates in an autonomous page migration mode whereby the page migration manager 134 initiates page transfers independent of instruction or other direction from the system software 136. To illustrate, the page migration manager 134 may autonomously initiate a page migration to transfer a heavily accessed page from the NVRAM memory 123 to the DRAM memory 125 due to the lower latency typically provided by the DRAM memory 125 relative to the NVRAM memory 123. In some implementations, while autonomous, the page migration manager 134 makes the system software 136 aware of these page migrations (that is, these page migrations are "visible" to the system software 136), in which case the system software 136 handles the address translations for memory access requests as necessitated by the page migrations. An example of this software-visible autonomous migration mode is described below with reference to FIG. 5.

The page migration manager 134 also may perform page migrations in a manner in which the system software 136 is not aware of the page migrations (that is, the page migrations are "invisible" to the system software 136). To illustrate, the die-stacked hybrid memory device 102 may be implemented so as to present a simple, uniform, flat memory space to the external device 104, even though in reality multiple memory architectures are implemented by the die-stacked hybrid memory device 102. As the system software 136 is unaware of these page migrations, the page migration manager 134 makes use of an internal mapping structure (not shown in FIG. 1) to store page mapping information and address translation logic that uses the stored page mapping information to provide the necessary address translations for memory access requests directed to the affected pages. An example of this software-invisible autonomous migration mode is described below with reference to FIG. 6.

As described in greater detail below, the page migration manager 134 may monitor memory accesses to develop memory access statistics, and based on these memory access statistics autonomously trigger beneficial page migrations. Moreover, as noted, the page migration manager 134 may maintain an internal mapping structure to store page migration information for address translation purposes. To provide for the storage of such information, the page migration manager 134 may include storage elements (e.g., registers, caches, or content addressable memories) located at one or more of the logic dies 124 to store data and other information in support of these processes, or a portion or all of this supporting information may be stored in the memory cell circuitry 126 and 127.

The page migration manager 134, the memory interface 130, and the memory dies 120 and 122 together implement the logic and other circuitry to support access and maintenance of the bitcells of the memory cell circuitry 126 and 127 in accordance with this memory architecture. The memory dies 120 and 122 may implement peripheral logic circuitry 138 to support this access. The peripheral logic circuitry 138 may include, for example, line drivers, bitline/wordline precharging circuitry, refresh circuitry, row decoders, column select logic, row buffers, sense amplifiers, and the like. Further, in certain instances, the peripheral logic circuitry 138 may implement inter-die transfer logic 140 that assists the page migration manager 134 in directly transferring a memory page from one of the memory dies 120 to one of the memory dies 122, or vice versa, without requiring the page data to pass through the page migration manager 134 during the transfer. Thus, to initiate a page migration, the page migration manager 134 may initialize the inter-die transfer logic 140 at one or both of the source memory die and the destination memory die with the particulars of the page migration (e.g., source page, destination page, page size, etc.), and the inter-die transfer logic 140 may then complete the page transfer directly between the source memory die and the destination memory die using the through silicon vias (TSVs) or other interconnects connecting the two dies.

In the depicted implementation of FIG. 1, the die-stacked hybrid memory device 102 is implemented in a vertical stacking arrangement whereby power and signaling are transmitted between the logic dies 124 and the memory dies 120 and 122 using dense TSVs 150 or other vertical interconnects. Although FIG. 1 depicts the TSVs 150 in a set of centralized rows, the TSVs 150 instead may be more dispersed across the floorplans of the dies. Note that FIG. 1 provides an exploded-view representation of the dies 120, 122, and 124 to permit illustration of the TSVs 150 and the components of the dies 120, 122, and 124. In implementation, each of the dies overlies and is in contact with the preceding die. In some embodiments, the page migration manager 134 accesses the memory implemented at the memory dies 120 and 122 directly via the TSVs 150 (that is, the page migration manager 134 implements its own memory controller). In another embodiment, the memory interface 130 controls access to the TSVs 150 and thus the page migration manager 134 accesses the memory dies 120 and 122 through the memory interface 130.

The die-stacked hybrid memory device 102 may be fabricated using any of a variety of 3D integrated circuit fabrication processes. In one approach, the dies 120, 122, and 124 each are implemented as a separate substrate (e.g., bulk silicon) with active devices and one or more metal routing layers formed at an active surface. This approach can include a wafer-on-wafer process whereby a wafer comprising a matrix of dies is fabricated and thinned, and TSVs are etched through the bulk silicon. Multiple wafers are then stacked to achieve the illustrated layer configuration (e.g., a stack of two wafers comprising memory cell circuitry dies for the two memory dies 120, two wafers comprising memory cell circuitry dies for the two memory dies 122, and a wafer comprising the logic die for the logic die 124), aligned, and then joined via thermocompression. The resulting stacked wafer set is singulated to separate the individual 3D IC devices, which are then packaged. In a die-on-die process, the wafer implementing each corresponding die is first singulated, and then the dies are separately stacked and joined to fabricate the 3D IC devices. In a die-on-wafer approach, wafers for one or more layers are singulated to generate the dies for one or more layers, and these dies are then aligned and bonded to the corresponding die areas of another wafer, which is then singulated to produce the individual 3D IC devices. One benefit of fabricating the dies 120, 122, and 124 as dies on separate wafers is that a different fabrication process can be used to fabricate the logic dies 124 than that used to fabricate the memory dies 120 and 122, as well as that different fabrication processes can be used to fabricate the memory dies 120 and 122. Thus, a fabrication process that provides improved performance and lower power consumption may be used to fabricate the logic dies 124 (and thus provide faster and lower-power interface logic and circuitry for the page migration manager 134), whereas fabrication processes directed to the particular memory architecture types, and which provides improved cell density and improved leakage control may be used to fabricate the memory dies 120 and 122 (and thus provide more dense, lower-leakage bitcells for the stacked memory).

In another approach, the dies 120, 122, and 124 are fabricated using a monolithic 3D fabrication process whereby a single substrate is used and each die is formed on a preceding die using a layer transfer process, such as an ion-cut process. The die-stacked hybrid memory device 102 also may be fabricated using a combination of techniques. For example, the logic dies 124 may be fabricated using a monolithic 3D technique, the memory dies may be fabricated using a die-on-die or wafer-on-wafer technique, or vice versa, and the resulting logic die stack and memory die stack then may be bonded to form the 3D IC device for the die-stacked hybrid memory device 102.

Figure 2:
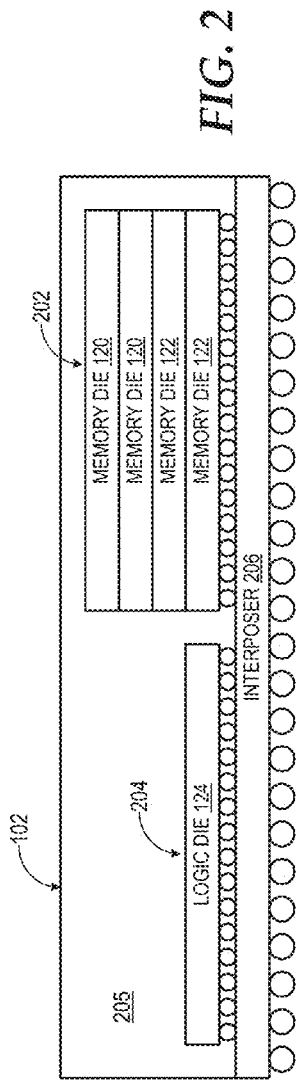
FIG. 2 is a diagram illustrating a cross-sectional view of a side-split configuration of the die-stacked hybrid memory device of FIG. 1 in accordance with some embodiments.

FIG. 2 illustrates a cross-section view of an alternative implementation of the die-stacked hybrid memory device 102 in accordance with another embodiment of the present disclosure. Rather than implement a vertical stack implementation as shown in FIG. 1 whereby the one or more logic dies 124 are vertically aligned with one or more memory dies 120 and 122, the die-stacked hybrid memory device 102 instead may implement the side-split arrangement of FIG. 2 whereby the one or more memory dies 120 and 122 are implemented as an IC device 202 and the one or more logic dies 124 are implemented as a separate IC device 204, and the IC devices 202 and 204 (and thus the logic dies 124 and the memory dies 120 and 122) are connected via an interposer 206. In this arrangement, the one or more memory dies 120 and 122 are "stacked" horizontally relative to the one or more logic dies 124. The interposer 206 can comprise, for example, one or more levels of silicon interposers, a printed circuit board (PCB), or a combination thereof. Although FIG. 2 illustrates the stacked memory dies 120 and 122 together implemented as a single IC device 202, the stacked memory dies 120 and 122 instead may be implemented as multiple IC devices 202, such as one IC device 202 comprising the memory dies 120 and another IC device 202 comprising the memory dies 122. Likewise, the logic dies 124 may be implemented as a single IC device 204 or as multiple IC devices 204. The one or more IC devices 202, the one or more IC devices 204, and the unifying interposer 206 are packaged as an IC package 205 representing the die-stacked hybrid memory device 102.

Figure 3:
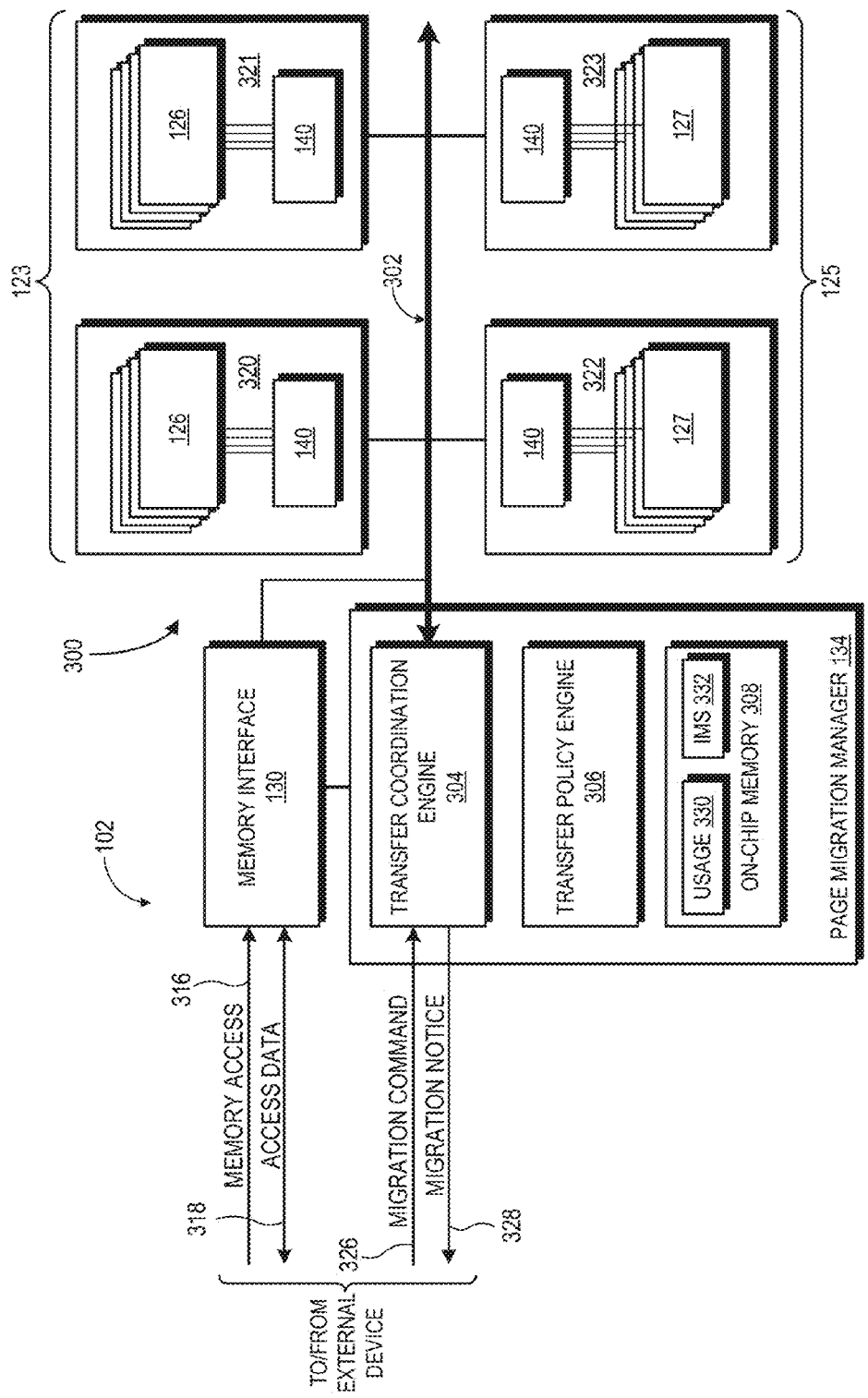
FIG. 3 is a block diagram illustrating a portion of the die-stacked hybrid memory device of FIG. 1 in greater detail in accordance with some embodiments.

FIG. 3 illustrates the memory interface 130, the page migration manager 134, the DRAM memory 125, and the NVRAM memory 123 of the die-stacked hybrid memory device 102 in block diagram form in accordance with some embodiments. For the illustrated example, the die-stacked hybrid memory device 102 collectively implements the memories 123 and 125 as a stacked memory 300 represented by two memory dies 320 and 321 (corresponding to the memory dies 120 of FIG. 1) implementing memory cell circuitry 126 having a NVRAM memory architecture type for the NVRAM memory 123 and two memory dies 322 and 323 (corresponding to the memory dies 122 of FIG. 1) implementing memory cell circuitry 127 having a DRAM memory architecture type for the DRAM memory 125. As also illustrated, each of the memory dies 320, 321, 322, and 323 (collectively, "memory dies 320-323") implements a separate instance of the inter-die transfer logic 140 for transferring page data directly between the memory dies via an inter-die interconnect network 302 that comprises TSVs and other vertical and horizontal interconnects. Likewise, the memory interface 130 and the page migration manager 134 may be connected to the memory dies 320-323 via this inter-die interconnect network 302. For ease of illustration, the collection of interconnects that couple the memory dies 320-323, the memory interface 130, and the page migration manager 134 are illustrated as a bus. However, in certain implementations, these interconnects may constitute multiple busses or other network connections between the various components.

In operation, the die-stacked hybrid memory device 102 can function as a conventional system memory for storing data on behalf of other system components. In a conventional memory access operation, an external device (e.g., external device 104 of FIG. 1) issues a memory access request 316 by manipulating the PHY of its memory controller interface 116 (FIG. 1) to transmit address signaling and, if the requested memory access is a write access, data signaling via the interconnect 106 to the die-stacked hybrid memory device 102. The PHY of the memory interface 130 receives the signaling, buffers the memory access request represented by the signaling, and then accesses the memory cell circuitry of the memory die corresponding to the location associated with the signaled address to fulfill the requested memory access. In the event that the memory access request 316 is a write access, the memory interface 130 stores the signaled data to the location of the stacked memory 300 indicated by the signaled address. In the event that the memory access request 316 is a read request, the memory interface 130 accesses the requested data from the location of the stacked memory 300 corresponding to the signaled address and manipulates the PHY of the memory interface 130 to transmit signaling representative of the accessed data 318 to the requesting external device via the interconnect 106.

As the stacked memory 300 of the die-stacked hybrid memory device 102 is a page-based memory, the page migration manager 134 can operate to selectively migrate memory pages between the memory dies 320 and 321 of the DRAM memory 125 and the memory dies 323 and 324 of the NVRAM memory 123 in view of various goals, including improved access times, improved write endurance, or reduced power consumption. To provide this functionality, the page migration manager 134 implements a transfer coordination engine 304, a transfer policy engine 306, and further may implement an on-chip memory 308. The transfer coordination engine 304 and the transfer policy engine 306 may be implemented as may be implemented as hardcoded or hardwired logic, as programmable logic, as an embedded processor executing software/firmware, or combinations thereof. To illustrate, in one embodiment, part or all of one or both of the transfer coordination engine 304 and the transfer policy engine 306 may be implemented as programmable logic devices using, for example, the techniques described in co-pending U.S. patent application Ser. No. 13/726,145, filed on Dec. 23, 2012 and entitled "Die-Stacked Memory Device with Reconfigurable Logic", the entirety of which is incorporated by reference herein. As another example, in one embodiment, part of all of one or both of the transfer coordination engine 304 and the transfer policy engine 306 may be implemented as a helper processor implemented at a logic die 124 (FIG. 1) and executing corresponding executable software instructions using, for example, the techniques described in co-pending U.S. patent application Ser. No. 13/567,958, filed on Aug. 6, 2012 and entitled "Stacked Memory Device with Helper Processor", the entirety of which is incorporated by reference herein. The on-chip memory 308 can comprise, for example, a storage structure (e.g., a cache, register file, or content-addressable memory) implemented on a logic die 124, a storage structure implemented on one or more of the memory dies 320-324, or a combination thereof.

The transfer coordination engine 304 operates to facilitate the migration of an identified memory page from the DRAM memory 125 to the NVRAM memory 123, or vice versa. In some embodiments, the transfer coordination engine 304 facilitates this page migration by retrieving the page data of the source page from the source memory and then storing the page data to the destination page of the destination memory, typically as a streaming process. However, this approach requires the page data to make a round trip from a source memory die of the stacked memory 300 to the page migration manager 134 and then back to a destination memory die of the stacked memory 300. To avoid the latency and bandwidth consumption of this approach, in other embodiments the transfer coordination engine 304 utilizes the inter-die transfer logic 140 of one or both of the source memory die and the destination memory die to facilitate a memory page migration. Under this approach, the transfer coordination engine 304 performs the control aspects of setup, initiation, and orchestration of the page transfer between memory dies, but does not handle the page data itself. Rather, the inter-die transfer logic receives this control information and performs the transfer of the page data directly between the source memory die and the destination memory die via the inter-die interconnect network 302 (e.g., directly via the TSVs 150 interconnecting the source and memory dies in the vertical stack configuration illustrated in FIG. 1). The process of transferring the page data from the source memory page location to the destination memory page location can use, for example, the techniques described in co-pending U.S. patent application Ser. No. 13/724,338, filed on Dec. 21, 2012 and entitled "Compound Memory Operations In a Logic Layer of Stacked Memory", the entirety of which is incorporated by reference herein.

The page migration manager 134 can operate in one or more page migration modes, including a software-initiated migration mode, a software-visible autonomous migration mode, and a software-invisible migration mode. In the software-initiated migration mode, the system software 136 initiates a page migration by issuing a migration command 326, which includes information identifying the source page and the destination page for the page migration. The migration command 326 may be implemented as, for example, a specific memory access command associated with page migrations and sent over the interconnect 106 (FIG. 1), as a special command sent over a separate bus or interconnect (e.g., via a side band bus), or as a control value and page address information that is written to a particular memory location of the stacked memory 300 or to a migration command queue that is used by the transfer coordination engine 304 to receive migration commands. Further, the migration command 326 may specify multiple pages to be transferred. Upon completion of the instructed page migration, the transfer coordination engine 304 issues a completion notice message via migration notice signaling 328. In this software-initiated mode, the system software 136 manages the page migration, and thus the system software 136 manages the process stalling necessary at the external device 104 needed to prevent accesses to the affected memory pages, as well as handling the address translation process at the external device 104 to ensure that memory access requests directed to the memory page at its original location are redirected to the new page location after the page migration is complete.

In the software-visible and software-invisible autonomous page migration modes, the page migration manager 134 autonomously initiates a page migration (that is, initiates a page migration without being instructed to do so by the system software 136). Typically, the autonomous decision to migrate a page from one of the memories 123 and 125 to the other memory is made in order to more fully leverage a benefit afforded by memory architecture of the destination memory. To illustrate, because DRAM memory typically is faster than PCM memory (one example of the NVRAM memory 123), the page migration manager 134 may decide to migrate a page in PCM memory that is being accessed frequently to the DRAM memory so as to take advantage of the lower access latency of the DRAM memory for future memory accesses to the page or, conversely, migrate a page in DRAM memory that comprises read-only data to the PCM memory because the read-only data will not affect the write endurance of the PCM memory. These page migration decisions thus are predicated on observations made by the page migration manager 134 on the memory usage of the stacked memory 300.

To this end, the transfer policy engine 306 monitors the usage of the stacked memory 300 and maintains resulting memory usage information 330 in the on-chip memory 308. As part of this monitoring process, the transfer policy engine 306 may monitor and maintain statistics and other information on memory page usage, such as frequency of access, least recently used (LRU) or most recently used (MRU) status, data type for a given page (e.g., real-time data vs. static data), application-assigned or system-software-assigned priority levels, and the like. The transfer policy engine 306 also may maintain information identifying which memory pages are permitted to migrate, and which are not.

To facilitate autonomous page migrations, the transfer policy engine 306 also implements various trigger conditions that provide for the triggering of a corresponding page migration when the trigger condition is determined to have been met based on the memory usage information 330. Thus, in operation, the transfer policy engine 306 monitors memory accesses and other information received from external devices to maintain the memory usage information 330, and applies the trigger event rules to the memory usage information 330 to initiate autonomous page migrations in an effort to improve the performance, efficiency, or durability of the die-stacked hybrid memory device 102. For example, when a frequency of access exceeds a specified threshold for a page in the relatively slower NVRAM memory 123 (one example of a trigger condition), the transfer policy engine 306 may trigger a page migration to transfer this page to the relatively faster DRAM memory 125, thereby reducing access latency for the frequent accesses predicted for this page going forward. When such trigger events are met, the transfer policy engine 306 signals the transfer coordination engine 304, which then initiates the page migration indicated by the transfer policy engine 306.

As noted above, this autonomous migration mode can be software-visible, in that the system software 136 is aware of the page migration initiated by the page migration manager 134. In the software-visible autonomous migration mode, the transfer coordination engine 304 signals the impending start of a page migration to the system software 136 via migration notice signaling 328, in response to which the system software 136 takes action to prevent memory access requests directed to the affected pages from being transmitted to the die-stacked hybrid memory device 102 while the page migration is in process. Once the page migration is complete, the transfer coordination engine 304 signals the page migration completion via the migration notice signaling 328, at which point the system software 136 ceases to stall memory access requests to the pages at issue. Moreover, because the system software 136 is aware of the page migration in this mode, the system software 136 can maintain and apply the address translation structures so as to properly translate addresses originally directed to the source page location to the new destination page location of the sought-after data of the migrated page.

The page migration manager 134 also may autonomously initiate page transfers in a software-invisible autonomous migration mode, whereby the system software 136 is not made aware of the page migrations. This may be for the purpose of abstracting the multiple memory types so as to appear to the system software 136 as a single uniform system memory, and thus offloading from the system software 136 the page migration decisions and address translation mechanisms necessary to support the page migrations. As the system software 136 is not aware of the page migrations, the page migration manager 134 instead must provide the address translations needed for received memory access requests that are directed to a page that has been moved. Accordingly, the page migration manager 134 maintains an internal mapping structure (IMS) 332 that stores the address translation information needed to map memory addresses directed to migrated pages. Thus, when a memory access request directed to a migrated page is received from an external device, the memory interface 130 can access the IMS 332 (either directly or via the transfer coordination engine 304) to obtain the address translation for the migrated page, and use the address translation to translate the original memory address associated with the memory access request to the corresponding address within the new page location of the migrated page.

To illustrate, the memory addresses signaled with memory access requests may comprise physical memory addresses having a page number and an offset value indicating an offset within the identified page. In such instances, the IMS 332 may include, for example, a content-addressable memory (CAM) having a plurality of entries, with each entry associated with a corresponding memory page that has been migrated and having an identifier of the source memory and source page number (that is, the one of memories 123 or 125 and the page number within that memory where the memory page originally was located) mapped to a corresponding identifier of the destination memory and destination page number (that is, the other of the memories 123 or 125 and the page number within that memory where the memory page currently is located). Thus, when a memory access request is received, the memory interface 130 can access the IMS 332 using the page number portion of the memory address associated with the memory access request as an index to determine whether there is a corresponding entry in the IMS 332. If not, the memory interface 130 can conclude that the memory access request is directed to a memory page that has not been migrated, and process the memory access request accordingly. If there is an entry in the IMS 332 that indexes to this original page number, then the memory interface 130 can replace the original page number in the memory address with the destination page number identified in the indexed entry to determine the modified memory address to be used to process the memory access request.

Figure 4:
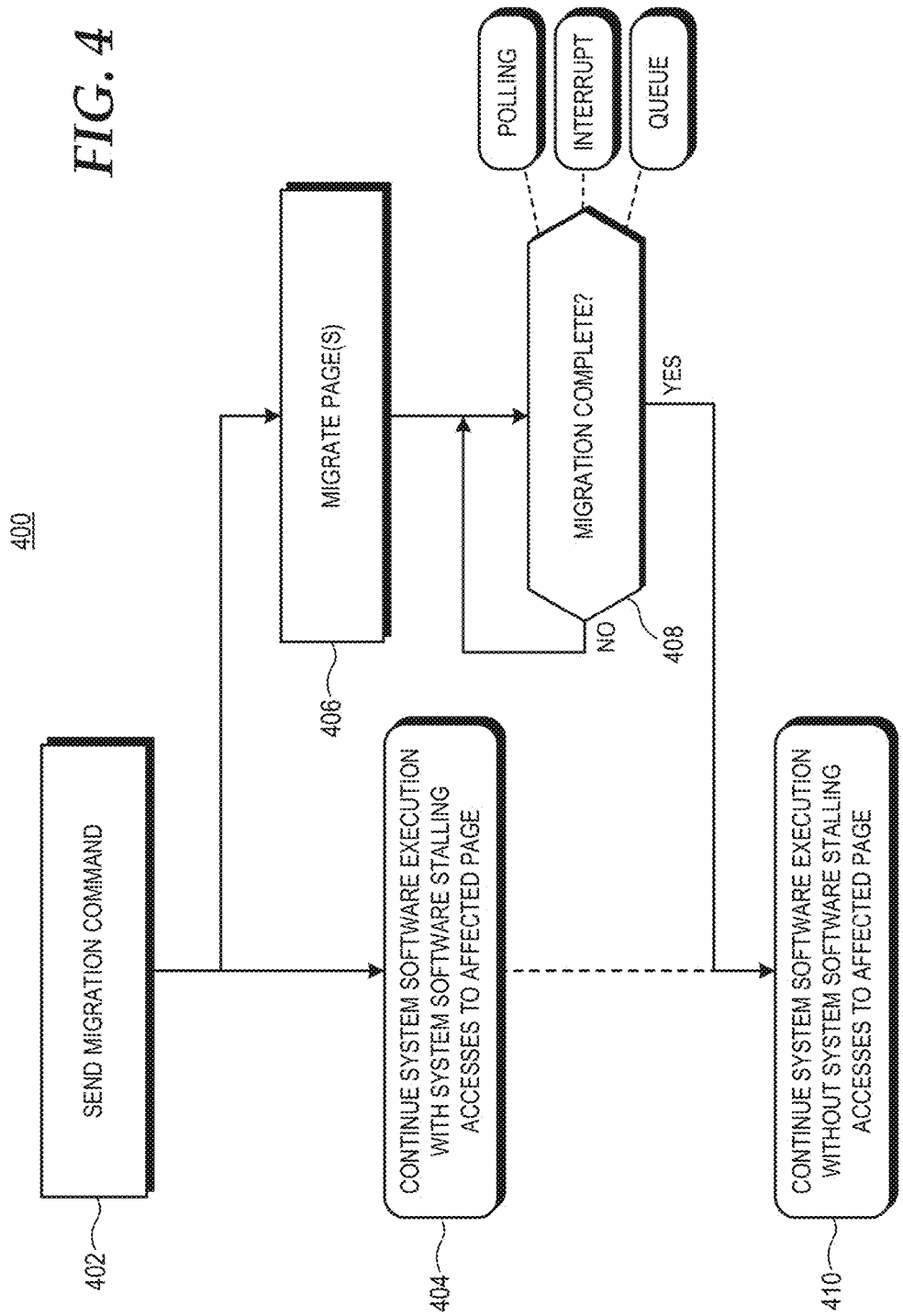
FIG. 4 is a flow diagram illustrating an example method for software-initiated page migrations within a die-stacked hybrid memory device in accordance with some embodiments.
Figure 5:
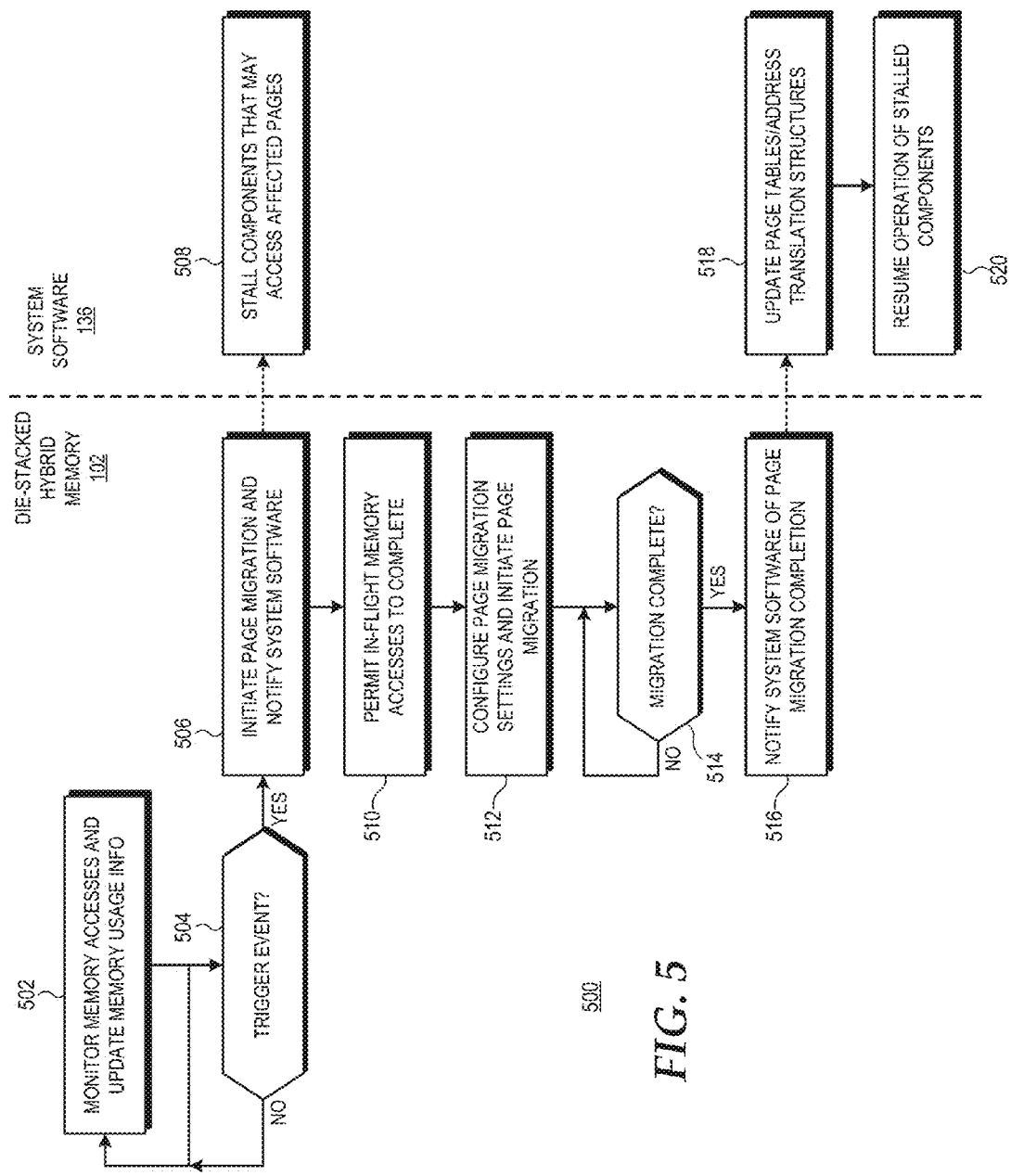
FIG. 5 is a flow diagram illustrating an example method for software-visible autonomous page migrations within a die-stacked hybrid memory device in accordance with some embodiments.
Figure 6:
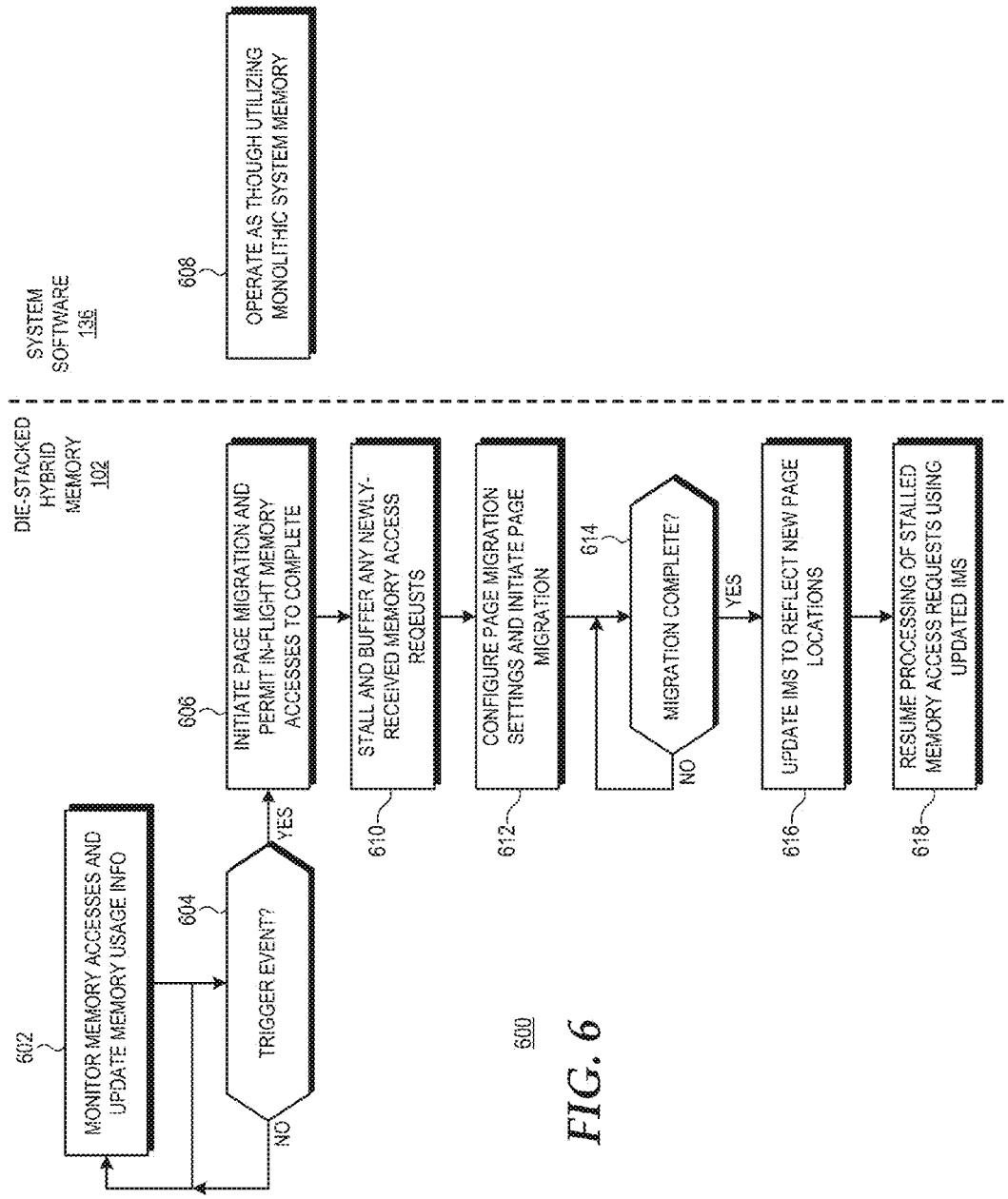
FIG. 6 is a flow diagram illustrating an example method for software-invisible autonomous page migrations within a die-stacked hybrid memory device in accordance with some embodiments.

FIGS. 4-6 illustrate various methods for implementing the software-initiated migration mode and the software-visible and software-invisible autonomous migration modes in accordance with at least one embodiment. For ease of illustration, these methods are described in the example context of the die-stacked hybrid memory device 102 of FIGS. 1 and 3.

FIG. 4 illustrates an example method 400 for memory page migrations in the software-initiated migration mode of the die-stacked hybrid memory device 102. In the software-initiated migration mode, it is the system software 136 that controls page migrations, and thus the system software 136 is both aware of the migration of memory pages, as well as responsible for directing the die-stacked hybrid memory device 102 with respect to performing page migrations. Accordingly, a page migration in the software-initiated migration mode starts at block 402 with the issuance of a migration command 326 from the system software 136 (via the external device 104) to the die-stacked hybrid memory device 102. Typically, this migration command 326 is initiated by the system software 136 in response to a condition (or change in condition) observed by the system software 136. The system software 136 may, for example, initiate a page migration to move a less-frequently accessed memory page from the DRAM memory 125 to the NVRAM memory 123 so as to free up space in the DRAM memory 125 for other more-frequently accessed memory pages, or initiate a page migration to move a memory page that has had an increase in priority status from the NVRAM memory 123 to the DRAM memory 125.

The migration command 326, in some embodiments, can include an identifier of the memory page to be transferred (e.g., the page number of the memory page) and, if there are more than two memory types within the stacked memory 300, the particular memory type to which the memory page is to be transferred. Further, in some instances, the system software 136 also may identify the destination page for the transfer, and thus the migration command 326 also may include an identifier of the destination page. In other instances, the system software 136 may leave the selection of the destination page to the page migration manager 134. In systems in which the page size may not be fixed, the migration command 326 also may specify the page size. However, as the memory address ranges of the memory space are mapped to the different types of memory, in other instances, the specified destination memory address is sufficient to imply or otherwise indirectly identify the destination memory type and thus it is unnecessary to utilize an explicit identifier of the destination memory type.

In response to issuing the migration command 326 (or in response to preparing to issue the migration command 326), at block 404 the system software 136 configures the external device 104 to ensure that processes running at the external device 104 do not interfere with, nor are irreversibly impacted by, the impending page migration. This configuration can include, for example, permitting any in-flight memory accesses to the affected memory page to complete and stalling any further memory accesses to the affected memory page. The stalling of these further memory accesses can be accomplished by the system software 136 by, for example, completely stalling the one or more processor cores that are executing, or are anticipated to be executing, software that may access the affected memory page.

In response to receiving the migration command 326, the page migration manager 134 performs the instructed page migration at block 406. In the event that the system software 136 has not identified the destination page, the page migration manager 134 may select a destination page from the unallocated pages in the destination memory. Further, as noted above, the page migration can be performed in a round-trip process whereby the page data is accessed by the transfer coordination engine 304 from the source page on one of the memory dies and then transferring the page data from the transfer coordination engine 304 to the destination page on the other of the memory dies. Alternatively, the transfer coordination engine 304 can configure the inter-die transfer logic 140 one or both of the source memory die and the destination memory die so as to perform a direct transfer of the page data between the two memory dies via the inter-die interconnect network 302.

At block 408, the system software 136 monitors for completion of the page migration so that it may cease process stalling and permit memory accesses to the new page location. In some embodiments, the system software 136 and the die-stacked hybrid memory device 102 use a specified location in the system 100, such as a register or a memory location in the stacked memory 300 that is updated by the transfer coordination engine 304 with a specified value when the page migration is complete. The system software 136 then may repeatedly poll this location until the specified value appears. This approach typically is best suited when the page migration is a short-duration event as the polling process can consume significant processing bandwidth. In other embodiments, the die-stacked hybrid memory device 102 uses inter-device signaling (e.g., migration notice signaling 328) with the external device 104, such as in the form of an interrupt request or a message written to a migration completion queue maintained at the external device 104 and that is periodically polled by the system software 136.

In response to completion of the page migration, at block 410 the system software 136 terminates the process stalling at the external device 104 and permits resumption of execution of processes that may access the page data. As part of the resumption of execution, the system software 136 updates its address translation structures (e.g., page tables) to reflect the new location of the migrated page data. This can include, for example, replacing the page entries for the source page in one or more page tables with corresponding page entries for the destination page. Accordingly, memory access requests directed to the migrated page data are translated by the external device 104 into physical or virtual memory addresses that reflect the new location of the migrated page.

FIG. 5 illustrates an example method 500 for memory page migrations in the software-visible autonomous migration mode of the die-stacked hybrid memory device 102. In this migration mode, the page migration manager 134 autonomously initiates page migrations to improve performance, reduce power consumption, or provide better wear-leveling, but the system software 136 is made aware of the page migrations. This awareness may thus result in the system software 136 providing the address translations needed to ensure that memory access requests directed to the migrated page are properly directed to the new location of the migrated page.

In at least one embodiment, the page migration manager 134 autonomously initiates page migrations in response to one or more types of trigger events, such as a page deallocation, detection of a frequency of access to a memory page exceeding a threshold, identification of a least frequently used page, a random selection of a memory page, a change in a power state, etc. To identify and react to these trigger events, at block 502 the transfer policy engine 306 monitors memory accesses to the stacked memory 300 and updates the memory usage information 330 accordingly. This monitoring process can include, for example, monitoring the allocation and deallocation of pages in each of the memories 123 and 125, monitoring the frequency of access to particular pages, monitoring relationships or patterns between memory accesses (e.g., observing that a memory access to one page tends to be closely followed by a memory access to another page or observing a page stride in memory accesses), monitoring the priority levels assigned to the pages by the system software 136 or applications executing at the external device 104, and the like.

In the course of monitoring the memory accesses and updating the memory usage information 330, at block 504 the transfer policy engine 306 also applies specified trigger rules or other trigger conditions to the memory usage information 330 to identify whether a trigger event has occurred. To illustrate, the trigger conditions may reflect trigger events such as the detection of a deallocation of a memory page in one of the memories 123 and 125, the access frequency of a memory page exceeding a specified threshold (that is, falling above an upper threshold or falling below a lower threshold), a detection in the priority level of a memory page, a detection in the read-only status of a memory page, a change in a power state, an identification of a least frequently used memory page (or most frequently used memory page), a random selection of a memory page for transfer purposes, etc.

If a trigger event is detected, at block 506 the transfer policy engine 306 directs the transfer coordination engine 304 to initiate one or more page migrations based on the trigger event. In at least one embodiment, the particular page migration enacted depends on the trigger event that spurred the page migration. For example, the deallocation of a page in the faster DRAM memory 125 may trigger the migration of a randomly-selected (or quasi-randomly selected) memory page from the NVRAM memory 123 to the now-available page at the DRAM memory 125. As another example, the detection of a memory page in the DRAM memory 125 as being a least recently used (LRU) memory page, a relatively-infrequently accessed memory, a read-only memory page, or a lower priority memory page may trigger the migration of the memory page from the DRAM memory 125 to the NVRAM memory 123 as the lower latency of the NVRAM memory 123 will not have as much of an impact, or in the case of the move of a read-only memory page, the read-only nature of the memory page will not have as much impact on the write-endurance of the NVRAM memory 123.

Also at block 506, the transfer coordination engine 304 notifies the system software 136 of the impending page migration. This notification can include, for example, an identifier of the page being migrated, including its source page location and its destination page location. In response to this notification, at block 508 the system software 136 stalls any components of the external device 104 that may initiate memory accesses to the affected page while the page migration is in process. As noted above, this stalling process can include, for example, stalling the issuance of memory access requests specifically to the affected memory page, stalling all memory access requests, or even stalling the one or more processor cores running processes that may try to access the affected page.

In anticipation of the page migration, at block 510 the memory interface 130 and the page migration manager 134 permit any memory accesses already in-flight at the die-stacked hybrid memory device 102 to complete before starting the page migration. At block 512, the transfer coordination engine 304 configures the page migration settings used to control or manage the page migration, such as by setting the source and destination page locations and page size parameters at control registers of the inter-die transfer logic 140. The inter-die transfer logic 140 then uses these control settings to transfer page data of the specified page size from a page at the specified source page location in a memory die of one of memories 123 and 125 to the specified destination page location in a memory die of the other memory. In other instances, the page data is accessed and transferred via the transfer coordination engine 304 itself.

When the page migration completes (as determined at block 514), the transfer coordination engine 304 notifies the system software 136 of the page migration completion at block 516. As described above, this notification can include storing a specified value to a polled location, transmitting a migration complete message to a migration completion queue maintained by the system software 136, directing the memory interface 130 to issue an interrupt request to the external device 104, and the like. In response to the page migration completing successfully, at block 518 the system software 136 updates its page tables or other address translation structures to reflect the new location of the migrated page. Alternatively, this update to the address translation information can instead be performed in response to the notification of the initiation of the page migration received by the system software 136 at block 506. Further in response to the page migration completion, at block 520 the system software 136 permits the components stalled at block 508 to resume operation. In the event that one of these components issues a memory access request directed to the migrated page, the system software 136 uses the updated page tables or other address translation structures to translate the memory address to redirect to the new location of the migrated page within the stacked memory 300.

FIG. 6 illustrates an example method 600 for memory page migrations in the software-invisible autonomous migration mode of the die-stacked hybrid memory device 102. In this migration mode, the page migration manager 134 autonomously initiates page migrations for various reasons, but in contrast with the software-visible mode described in FIG. 5, the system software 136 is not made aware of the page migrations. As such, the die-stacked hybrid memory device 102 provides the address translations necessary to redirect memory access requests from the original location of the page to the new location of the page after migration.

As with method 500 of FIG. 5, in the software-invisible autonomous migration mode represented by method 600, the page migration manager 134 autonomously maintains memory usage information (block 602) and applies trigger event conditions using this information to detect a trigger event (block 604). In response to the detection of a trigger event, at block 606 the transfer policy engine 306 directs the transfer coordination engine 304 to initiate one or more page migrations based on the trigger event. The particular page to be migrated, in one embodiment, is based at least in part on the type of trigger event detected, as discussed above. As part of the initiation process, any memory accesses already in-flight at the die-stacked hybrid memory device 102 are permitted to complete before starting the page migration. However, in contrast with method 500, in method 600 the system software 136 is not notified of the impending page migration. As such, as represented by block 608 the system software 136 and other applications running on the external device 104 continue to operate as though the affected page remains in its original location.

Because the system software 136 is unaware of the page migration, the system software 136 will continue to permit the issuance of memory access requests to the affected memory page. Accordingly, at block 610 the page migration manager 134 directs the memory interface 130 to buffer or queue any newly-received memory access requests that are directed to the affected page while the page migration is in process. This delays processing of the memory access requests and thus has the effect of stalling the processes that issued the memory requests at the external device 104, but in a manner in which the system software 136 is unaware of the reason for the delayed memory accesses.

At block 612, the transfer coordination engine 304 configures the page migration settings used to control or manage the page migration, such as by setting the source and destination page locations and page size parameters at control registers of the inter-die transfer logic 140. The inter-die transfer logic 140 then uses these control settings to transfer page data of the specified page size from a page at the specified source page location in a memory die of one of memories 123 and 125 to the specified destination page location in a memory die of the other memory.

When the page migration completes (as determined at block 614), the transfer coordination engine 304 updates the IMS 332 to reflect the new location of the migrated page at block 616. Alternatively, this update to the IMS 332 can instead be performed in response to the initiation of the page migration. Further in response to the page migration completion, at block 618 the page migration manager 134 notifies the memory interface 130 of completion of the page migration, in response to which the memory interface 130 can resume processing of the buffered memory access requests that were stalled at block 620. In the processing of these stalled memory access requests, and any subsequent memory access request directed to the migrated page, the memory interface 130 uses the corresponding address translation entry in the IMS 332 to translate the page location in the original memory address to a revised page location in a translated memory address, and then accesses the specified location within the migrated page accordingly.

Figure 7:
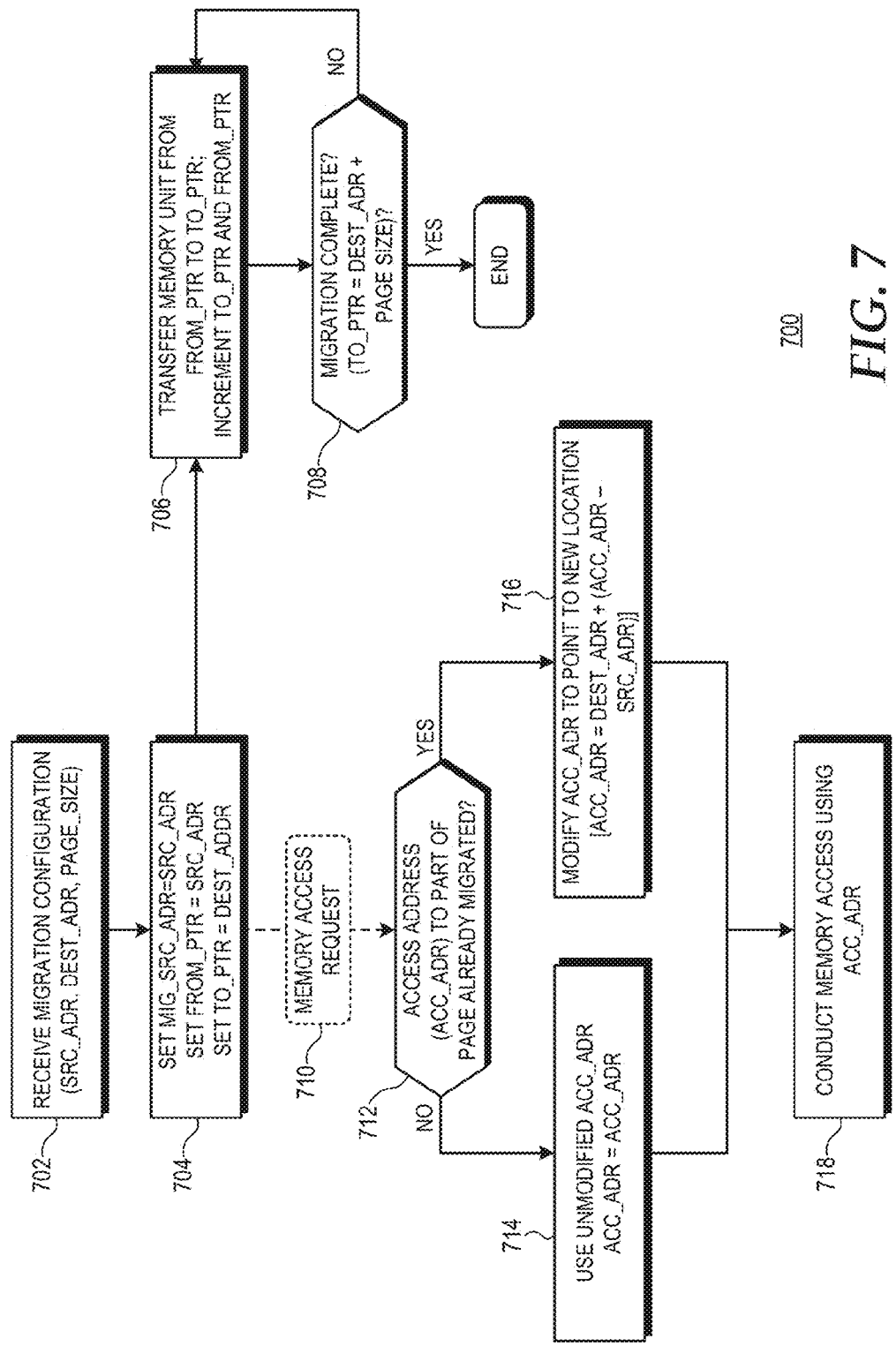
FIG. 7 is a flow diagram illustrating an example method for facilitating memory access to a memory page while the memory page is being transferred within a die-stacked hybrid memory device in accordance with some embodiments.

FIG. 7 illustrates a method 700 for facilitating memory accesses to a memory page while the memory page is in the process of being migrated from one memory type to another memory type in accordance with at least some embodiments. The method 700 thus addresses the problem of stalling memory access requests directed to pages being migrated by permitting the calculation of the current location of the requested data during the page migration process. Thus, the memory interface 130 and the page migration manager 134 can coordinate as described below to calculate the appropriate memory address for a memory access request to a page being migrated without requiring the memory access to stall at either the external device 104 or the memory interface 130. As such, the technique represented by method 700 may be used in place of the memory access request stalling processes described above with reference to blocks 404, 508, and 610 of FIGS. 4, 5, and 6, respectively.

The method 700 initiates at 702 with the page migration manager 134 receiving notice of the migration configuration information for the page to be migrated, including the source address (SRC_ADR) of the page at one of the memory dies, the destination address (DEST_ADR) for the page at another of the memory dies, and an indicator of page size (PAGE_SIZE) of the page. At block 704, the page migration manager 134 sets various variables based on this configuration information, including initializing a variable MIG_SRC_ADR to SRC_ADR, a pointer FROM_PTR to SRC_ADR, and a pointer TO_PTR to DEST_ADR.

With the variables initialized, the page migration manager 134 initiates the page migration. This process includes an iterations of block 706, whereby the inter-die transfer logic 140 transfers a memory unit (e.g., a cache line of data) from the source page at a location referenced by FROM_PTR to the destination page at a location referenced by TO_PTR (which are then incremented after the memory unit has been transferred). After each iteration of block 706, the page migration manager 134 determines, at block 708, whether the page migration has completed by determining whether TO_PTR equals the sum of the destination address (DEST_ADR) and PAGE_SIZE (that is, whether TO_PTR has been incremented a number of times equal to the number of memory units in the page). If so, the page migration process has completed. If not, the method 700 returns to block 706 to transfer the next memory unit of the page being migrated.

In parallel with the page migration process of blocks 706 and 708, the die-stacked hybrid memory device 102 receives a memory access request (represented by block 710). At block 712, the memory interface 310 determines whether the memory address (ACC_ADR) of the memory access request is directed to the page being migrated, and in particular, whether it is directed to a portion of the page already migrated, or a part of the page that has not yet been migrated. In one embodiment, the memory access request is identified as being directed to a portion of a page of a page that has already been migrated if the memory address ACC_ADR is between MIG_SRC_ADR and FROM_PTR. If the memory access request is directed to a page other than the page being migrated or to a portion of the page that has not yet been migrated, at block 714 the memory interface 130 maintains the original memory address of the memory access request. Otherwise, if the memory access request is directed to a portion of the page that has already been migrated, at block 716 the memory interface 130 determines a new version of ACC_ADR as equal to DEST_ADR+(ACC_ADR−SRC_ADR). At block 718 the memory interface 130 conducts the memory access using the ACC_ADR, either in its original value or modified value depending on whether the requested memory location within the page has been transferred already.

In some embodiments, the apparatus and techniques described above are implemented in a system comprising one or more integrated circuit (IC) devices (also referred to as integrated circuit packages or microchips), such as the die-stacked hybrid memory device 102 described above with reference to FIGS. 1-7. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a non-transitory computer readable storage medium accessible to the computing system. Likewise, the code representative of one or more phases of the design or fabrication of an IC device may be stored in and accessed from the same computer readable storage medium or a different computer readable storage medium.

A non-transitory computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 8:
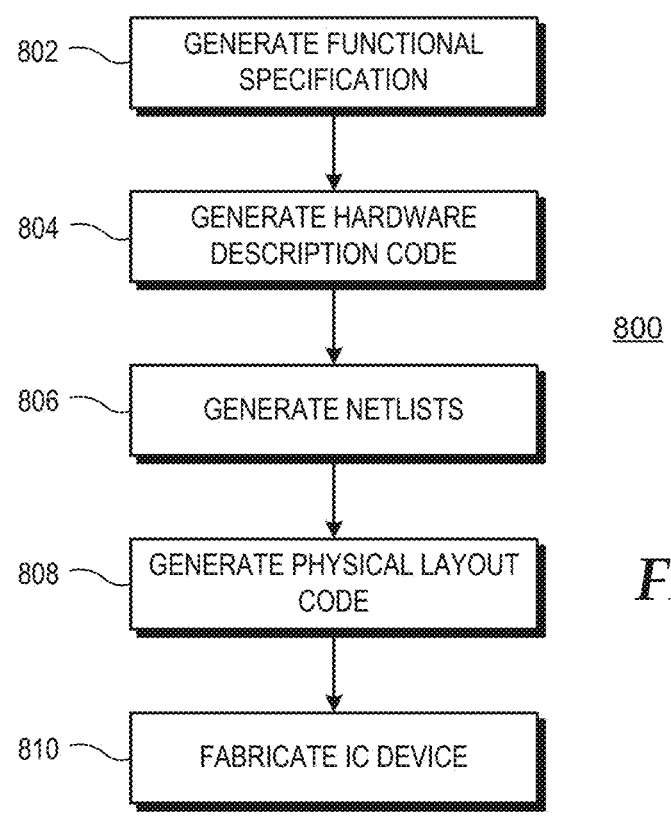
FIG. 8 is a flow diagram illustrating a method for designing and fabricating an integrated circuit (IC) package implementing a die-stacked hybrid memory device in accordance with some embodiments.

FIG. 8 is a flow diagram illustrating an example method 800 for the design and fabrication of an IC device implementing one or more aspects. As noted above, the code generated for each of the following processes is stored or otherwise embodied in computer readable storage media for access and use by the corresponding design tool or fabrication tool.

At block 802 a functional specification for the IC device is generated. The functional specification (often referred to as a micro architecture specification (MAS)) may be represented by any of a variety of programming languages or modeling languages, including C, C++, SystemC, Simulink™, or MATLAB™.

At block 804, the functional specification is used to generate hardware description code representative of the hardware of the IC device. In at some embodiments, the hardware description code is represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 806 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable media) representing the components and connectivity of the circuit diagram. The captured circuit diagram may then be subjected to one or more rounds of simulation for testing and verification.

At block 808, one or more EDA tools use the netlists produced at block 806 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 810, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:
1. An integrated circuit (IC) device comprising:
   a die-stacked hybrid memory device comprising:
      a first set of one or more memory dies implementing first memory cell circuitry of a first memory architecture type;
      a second set of one or more memory dies implementing second memory cell circuitry of a second memory architecture type different than the first memory architecture type; and
      a set of one or more logic dies electrically coupled to the first and second sets of one or more memory dies, the set of one or more logic dies comprising a memory interface and a page migration manager, the memory interface coupleable to a device external to the die-stacked hybrid memory device, and the page migration manager to transfer memory pages between the first set of one or more memory dies and the second set of one or more memory dies;
   wherein:
      the page migration manager is to implement an autonomous migration mode whereby the page migration manager is to initiate transfer of a first memory page from a memory die of one of the first and second sets of memory dies to a memory die of the other of the first and second sets of memory dies independent of a migration command from system software executed on a device external to the die-stacked hybrid memory device;
      the autonomous migration mode is a software-visible autonomous migration mode; the page migration manager is to notify the system software prior to initiating the transfer of the first memory page; and
      the page migration manager is to notify the system software of completion of the transfer of the first memory page.

2. The IC device of claim 1, wherein the page migration manager is to signal a completion of the transfer of the first memory page using at least one of: a value stored to a location polled by the system software; an interrupt issued to the external device; and a message stored to a migration completion message queue accessible to the system software.

3. The IC device of claim 1, wherein:
the first set of one or more memory dies and the second set of one or more memory dies are interconnected via a set of through silicon vias; and
the first set of one or more dies and the second set of one or more dies comprise inter-die transfer logic to facilitate moving of pages directly between memory dies via the set of through silicon vias responsive to signaling from the page migration manager.

4. The IC device of claim 1, wherein:
the first memory architecture type comprises a volatile memory architecture; and
the second memory architecture type comprises a non-volatile memory architecture.

5. The IC device of claim 1, wherein the page migration manager further is to generate memory usage information based on monitoring of memory accesses by the external device and to transfer memory pages between the first set of one or more memory dies and the second set of one or more memory dies responsive to a trigger event that is based on the memory usage information.

6. The IC device of claim 5, wherein:
the first memory cell circuitry has at least one of a lower latency and a higher bandwidth than the second memory cell circuitry;
the transfer of the first memory page is a transfer of the first memory page from the second set of one or more memory dies to the first set of one or more memory dies; and
the trigger event comprises at least one of: a deallocation of a second memory page in the first set of one or more memory dies; an identification of the first memory page as storing real-time data; identification of the first memory page as data associated with a process having a higher priority level; and a change in a power state of the IC device.

7. The IC device of claim 5, wherein:
the first memory cell circuitry has a more limited write endurance than the second memory cell circuitry;
the transfer of the first memory page is a transfer of the first memory page from the second set of one or more memory dies to the first set of one or more memory dies; and
the trigger event comprises an identification of the first memory page as a read-only memory page.

8. A method comprising:
providing an integrated circuit (IC) device comprising a first set of one or more memory dies implementing first memory cell circuitry of a first memory architecture type, a second set of one or more memory dies implementing second memory cell circuitry of a second memory architecture type different than the first memory architecture type, and a set of one or more logic dies electrically coupled to the first and second sets of one or more memory dies, the set of one or more logic dies comprising a memory interface and a page migration manager;
operating the memory interface to perform memory accesses for an external device; and
operating the page migration manager in an autonomous migration mode whereby the page migration manager is to initiate transfer of a first memory page from a memory die of one of the first and second sets of memory dies to a memory die of the other of the first and second sets of memory dies independent of a migration command from system software executed on a device external to the IC device;
wherein the autonomous migration mode is a software-visible autonomous migration mode; and
wherein operating the page migration manager further comprises operating the page migration manager to notify the system software prior to initiating the transfer of the first memory page and to notify the system software of completion of the transfer of the first memory page.

9. The method of claim 8, further comprising:
operating the page migration manager to generate memory usage information based on monitoring of memory accesses by the external device; and
operating the page migration manager to transfer memory pages between the first set of one or more memory dies and the second set of one or more memory dies responsive to a trigger event that is based on the memory usage information.

10. The method of claim 9, wherein operating the page migration manager to notify the system software of completion of the transfer of the first memory page comprises operating the page migration manager to signal the completion of the transfer of the first memory page using at least one of: a value stored to a location polled by the system software; an interrupt issued to the external device; and a message stored to a migration completion message queue accessible to the system software.

* * * * *